(12) United States Patent
Zheng et al.

(10) Patent No.: US 7,985,994 B2
(45) Date of Patent: Jul. 26, 2011

(54) FLUX-CLOSED STRAM WITH ELECTRONICALLY REFLECTIVE INSULATIVE SPACER

(75) Inventors: Yuankai Zheng, Bloomington, MN (US); Dimitar V. Dimitrov, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 136 days.

(21) Appl. No.: 12/239,884

(22) Filed: Sep. 29, 2008

(65) Prior Publication Data

US 2010/0078742 A1 Apr. 1, 2010

(51) Int. Cl.
    *H01L 21/02* (2006.01)
(52) U.S. Cl. .............. 257/295; 257/E27.104; 365/173
(58) Field of Classification Search .................. None
    See application file for complete search history.

(56) References Cited

U.S. PATENT DOCUMENTS

| | | | |
|---|---|---|---|
| 4,733,371 A | 3/1988 | Terada |
| 5,191,223 A | 3/1993 | Munekata |
| 5,646,419 A | 7/1997 | McCaldin |
| 5,673,225 A | 9/1997 | Jeong |
| 5,761,115 A | 6/1998 | Kozicki |
| 5,920,446 A | 7/1999 | Gill |
| 5,982,670 A | 11/1999 | Yamashita |
| 6,072,718 A | 6/2000 | Abraham |
| 6,178,136 B1 | 1/2001 | Lin |
| 6,226,197 B1 | 5/2001 | Nishimura |
| 6,252,796 B1 | 6/2001 | Lenssen |
| 6,381,106 B1 | 4/2002 | Pinarbasi |
| 6,469,926 B1 | 10/2002 | Chen |
| 6,532,164 B2 | 3/2003 | Redon |
| 6,542,000 B1 | 4/2003 | Black |
| 6,569,745 B2 | 5/2003 | Hsu |
| 6,584,016 B2 | 6/2003 | Park |
| 6,603,677 B2 | 8/2003 | Wood |
| 6,633,498 B1 | 10/2003 | Engel |
| 6,639,830 B1 | 10/2003 | Watanbe |
| 6,643,168 B2 | 11/2003 | Okazawa |
| 6,700,753 B2 | 3/2004 | Singleton |
| 6,703,645 B2 | 3/2004 | Ohno |
| 6,711,051 B1 | 3/2004 | Poplevine |
| 6,711,067 B1 | 3/2004 | Kablanian |
| 6,714,444 B2 | 3/2004 | Huai |
| 6,741,492 B2 | 5/2004 | Nii |
| 6,744,086 B2 | 6/2004 | Daughton |
| 6,759,263 B2 | 6/2004 | Ying |

(Continued)

FOREIGN PATENT DOCUMENTS

GB          2 422 735          8/2006

(Continued)

OTHER PUBLICATIONS

Zheng et al., Low Switching Current Flux-Closed Magnetoresistive Random Access Memory, Journal of Applied Physics, May 15, 2003.

(Continued)

*Primary Examiner* — Jarrett J Stark
(74) *Attorney, Agent, or Firm* — Campbell Nelson Whipps LLC

(57) ABSTRACT

Flux-closed spin-transfer torque memory having a specular insulative spacer is disclosed. A flux-closed spin-transfer torque memory unit includes a multilayer free magnetic element including a first free magnetic layer anti-ferromagnetically coupled to a second free magnetic layer through an electrically insulating and electronically reflective layer. An electrically insulating and non-magnetic tunneling barrier layer separates the free magnetic element from a reference magnetic layer.

26 Claims, 5 Drawing Sheets

U.S. PATENT DOCUMENTS

| | | |
|---|---|---|
| 6,765,819 B1 | 7/2004 | Bhattacharyya |
| 6,774,391 B1 | 8/2004 | Cowburn |
| 6,781,867 B2 | 8/2004 | Kurth |
| 6,781,871 B2 | 8/2004 | Park |
| 6,818,961 B1 | 11/2004 | Rizzo |
| 6,829,161 B2 | 12/2004 | Huai |
| 6,831,312 B2 | 12/2004 | Slaughter |
| 6,834,005 B1 | 12/2004 | Parkin |
| 6,835,423 B2 | 12/2004 | Chen |
| 6,838,740 B2 | 1/2005 | Huai |
| 6,842,368 B2 | 1/2005 | Hayakawa |
| 6,845,038 B1 | 1/2005 | Shukh |
| 6,847,547 B2 | 1/2005 | Albert |
| 6,850,433 B2 | 2/2005 | Sharma |
| 6,864,551 B2 | 3/2005 | Tsang |
| 6,888,703 B2 | 5/2005 | Princinsky |
| 6,888,742 B1 | 5/2005 | Nguyen |
| 6,909,633 B2 | 6/2005 | Tsang |
| 6,914,807 B2 | 7/2005 | Nakamura |
| 6,920,063 B2 | 7/2005 | Huai |
| 6,930,910 B2 | 8/2005 | Oh |
| 6,933,155 B2 | 8/2005 | Albert |
| 6,943,040 B2 | 9/2005 | Min |
| 6,801,415 B2 | 10/2005 | Slaughter |
| 6,958,927 B1 | 10/2005 | Nguyen |
| 6,963,500 B2 | 11/2005 | Tsang |
| 6,965,522 B2 | 11/2005 | Lung |
| 6,967,863 B2 | 11/2005 | Huai |
| 6,979,586 B2 | 12/2005 | Guo |
| 6,985,378 B2 | 1/2006 | Kozicki |
| 6,985,385 B2 | 1/2006 | Nguyen |
| 6,992,359 B2 | 1/2006 | Nguyen |
| 6,998,150 B2 | 2/2006 | Li |
| 7,009,877 B1 | 3/2006 | Huai |
| 7,020,024 B2 | 3/2006 | Sim |
| 7,057,921 B2 | 6/2006 | Valet |
| 7,067,330 B2 | 6/2006 | Min |
| 7,067,866 B2 | 6/2006 | Shi |
| 7,088,609 B2 | 8/2006 | Valet |
| 7,088,624 B2 | 8/2006 | Daniel |
| 7,092,279 B1 | 8/2006 | Sheppard |
| 7,093,347 B2 | 8/2006 | Nowak |
| 7,098,494 B2 | 8/2006 | Pakala |
| 7,098,495 B2 | 8/2006 | Sun |
| 7,099,186 B1 | 8/2006 | Braun |
| 7,105,372 B2 | 9/2006 | Min |
| 7,110,284 B2 | 9/2006 | Hayakawa |
| 7,110,287 B2 | 9/2006 | Huai |
| 7,126,202 B2 | 10/2006 | Huai |
| 7,138,648 B2 | 11/2006 | Kneissl |
| 7,161,829 B2 | 1/2007 | Huai |
| 7,187,577 B1 | 3/2007 | Wang |
| 7,189,435 B2 | 3/2007 | Tuominen |
| 7,190,611 B2 | 3/2007 | Nguyen |
| 7,196,882 B2 | 3/2007 | Deak |
| 7,224,601 B2 | 5/2007 | Pancula |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,241,632 B2 | 7/2007 | Vang |
| 7,242,045 B2 | 7/2007 | Nguyen |
| 7,242,048 B2 | 7/2007 | Huai |
| 7,245,462 B2 | 7/2007 | Huai |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,285,836 B2 | 10/2007 | Ju |
| 7,286,395 B2 | 10/2007 | Chen |
| 7,289,356 B2 | 10/2007 | Diao |
| 7,345,912 B2 | 3/2008 | Luo |
| 7,369,427 B2 | 5/2008 | Diao |
| 7,379,327 B2 | 5/2008 | Chen |
| 7,385,842 B2 | 6/2008 | Deak |
| 7,403,418 B2 | 7/2008 | Lin |
| 7,408,806 B2 | 8/2008 | Park |
| 7,411,815 B2 | 8/2008 | Gogl |
| 7,430,135 B2 | 9/2008 | Hua |
| 7,477,491 B2 | 1/2009 | Li |
| 7,480,173 B2 | 1/2009 | Guo |
| 7,485,503 B2 | 2/2009 | Brask |
| 7,486,551 B1 | 2/2009 | Li |
| 7,486,552 B2 | 2/2009 | Apalkov |
| 7,489,541 B2 | 2/2009 | Pakala |
| 7,495,867 B2 | 2/2009 | Sbiaa |
| 7,502,249 B1 | 3/2009 | Ding |
| 7,515,457 B2 | 4/2009 | Chen |
| 7,518,835 B2 | 4/2009 | Huai |
| 7,539,047 B2 | 5/2009 | Katti |
| 7,572,645 B2 | 8/2009 | Sun |
| 7,573,736 B2 | 8/2009 | Wang |
| 7,576,956 B2 | 8/2009 | Huai |
| 7,728,622 B2 | 6/2010 | Fujita |
| 2003/0011945 A1 | 1/2003 | Yuasa |
| 2003/0137864 A1 | 7/2003 | Holden |
| 2004/0008537 A1 | 1/2004 | Sharma |
| 2004/0084702 A1 | 5/2004 | Jeong |
| 2004/0090809 A1 | 5/2004 | Tran |
| 2004/0170055 A1 | 9/2004 | Albert |
| 2004/0179311 A1 | 9/2004 | Li |
| 2004/0197579 A1 | 10/2004 | Chen |
| 2005/0048674 A1 | 3/2005 | Shi |
| 2005/0068684 A1 | 3/2005 | Gill |
| 2005/0139883 A1 | 6/2005 | Sharma |
| 2005/0141640 A1 | 6/2005 | Huai |
| 2005/0150535 A1 | 7/2005 | Samavedam |
| 2005/0150537 A1 | 7/2005 | Ghoshal |
| 2005/0184839 A1 | 8/2005 | Nguyen |
| 2005/0185459 A1 | 8/2005 | Fukuzumi |
| 2005/0237787 A1 | 10/2005 | Huai |
| 2005/0254286 A1 | 11/2005 | Valet |
| 2005/0269612 A1 | 12/2005 | Torok |
| 2005/0275003 A1 | 12/2005 | Shinmura |
| 2005/0282379 A1 | 12/2005 | Saito |
| 2006/0049472 A1 | 3/2006 | Diao |
| 2006/0060832 A1 | 3/2006 | Symanczyk |
| 2006/0061919 A1 | 3/2006 | Li |
| 2006/0083047 A1 | 4/2006 | Fujita |
| 2006/0171199 A1 | 8/2006 | Ju |
| 2006/0233017 A1 | 10/2006 | Hosotani |
| 2006/0245117 A1 | 11/2006 | Nowak |
| 2007/0002504 A1 | 1/2007 | Chambers |
| 2007/0007609 A1 | 1/2007 | Saito |
| 2007/0008661 A1 | 1/2007 | Min |
| 2007/0025164 A1 | 2/2007 | Kim |
| 2007/0029630 A1 | 2/2007 | Seyyedy |
| 2007/0035890 A1 | 2/2007 | Sbiaa |
| 2007/0047294 A1 | 3/2007 | Panchula |
| 2007/0054450 A1 | 3/2007 | Hong |
| 2007/0063237 A1 | 3/2007 | Huai |
| 2007/0064352 A1 | 3/2007 | Gill |
| 2007/0069314 A1 | 3/2007 | Wilson |
| 2007/0085068 A1* | 4/2007 | Apalkov et al. ............ 257/1 |
| 2007/0096229 A1 | 5/2007 | Yoshikawa |
| 2007/0120210 A1 | 5/2007 | Yuan |
| 2007/0132049 A1 | 6/2007 | Stipe |
| 2007/0164380 A1 | 7/2007 | Min |
| 2007/0171694 A1 | 7/2007 | Huai |
| 2007/0230233 A1 | 10/2007 | Takahashi |
| 2007/0241392 A1 | 10/2007 | Lin |
| 2007/0246787 A1 | 10/2007 | Wang |
| 2007/0297220 A1 | 12/2007 | Yoshikawa |
| 2008/0026253 A1 | 1/2008 | Yuasa |
| 2008/0061388 A1 | 3/2008 | Diao |
| 2008/0130354 A1 | 6/2008 | Ho |
| 2008/0179699 A1 | 7/2008 | Horng |
| 2008/0191251 A1 | 8/2008 | Ranjan |
| 2008/0258247 A1 | 10/2008 | Mancoff |
| 2008/0265347 A1 | 10/2008 | Iwayama |
| 2008/0273380 A1 | 11/2008 | Diao |
| 2008/0277703 A1 | 11/2008 | Iwayama |
| 2008/0291721 A1 | 11/2008 | Apalkov |
| 2008/0310213 A1 | 12/2008 | Chen |
| 2008/0310219 A1 | 12/2008 | Chen |
| 2009/0027810 A1 | 1/2009 | Horng |
| 2009/0040855 A1 | 2/2009 | Luo |

| | | |
|---|---|---|
| 2009/0050991 A1 | 2/2009 | Nagai |
| 2009/0073756 A1 | 3/2009 | Yang |
| 2009/0185410 A1 | 7/2009 | Huai |
| 2009/0218645 A1 | 9/2009 | Ranjan |
| 2009/0257154 A1 | 10/2009 | Carey |
| 2009/0296454 A1 | 12/2009 | Honda |
| 2009/0302403 A1 | 12/2009 | Nguyen |
| 2010/0034009 A1 | 2/2010 | Lu |
| 2010/0118600 A1 | 5/2010 | Nagasi |
| 2010/0176471 A1 | 7/2010 | Zhu |

FOREIGN PATENT DOCUMENTS

| | | |
|---|---|---|
| WO | WO 2004093087 A1 * | 10/2004 |
| WO | WO 2008/100868 | 8/2008 |

OTHER PUBLICATIONS

Egelhoff et al., Oxygen as a Surfactant in the Growth of Giant Magnetoresistance Spin Valves, Journal of Applied Physics 82 (12), Dec. 15 1997.
Slonczewski, Current-Driven Excitation of Magnetic Multilayers, Journal of Magnetism and Magnetic Materials 159 (1996) L1-L7.
Sun, Current-Driven Magnetic Switching in Manganite Trilayer Junctions, Journal of Magnetism and Magnetic Materials 202 (1999) 157-162.
Li et al., Role of Oxygen Exposure in Different Positions in the Synthetic Spin Valves, Journal of Applied Physics, vol. 93, No. 10, May 15, 2003.
U.S. Appl. No. 12/239,887, filed Sep. 29, 2008, Our Ref: 1011.14596.00.
U.S. Appl. No. 12/239,882, filed Sep. 29, 2008, Our Ref: 1011.14597.00.
Search Report and Written Opinion dated Mar. 22, 2010.
Baek et al., Tech. Dig. IEDM (2004) 587.
Berger, Emission of Spin Waves by Magnetic Multilayer Traversed by a Current, Physic. Review B 54, 9353 (1996).
Black et al., Programmable Logic Using Giant Magnetoresistance and Spin-Dependent Tunneling Devices (Invited), J. Appl. Phys. 87, 6674 (2000).
Chu et al., Fabrication of Ideally Ordered Nanoporous Alumina Films and Integrated Alumina Nanotubule Arrays by High-Field Anodization, Adv. Mater. 2005, 17, 2115-2119.
Cowburn et al., Room Temperature Magnetic Quantum Cellular Automata, Science 287, 1466 (2000).
de Groot et al., New Class of Materials: Half-Metallic Ferromagnets, Physics Review Letters, 50, 2024 (1983).
Emley, N.C., et al., Reduction of Spin Transfer by Synthetic Antiferromagnets, Applied Physics Letters, May 24, 2004, pp. 4257-4259, vol. 84, No. 21.
Folk et al., A Gate-Controlled Bidirectional Spin Filter Using Quantum Coherence, Science, vol. 299, Jan. 31, 2003, pp. 679-682.
Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-1060.
Huczko, Template-Based Synthesis of Nanomaterials, Appl. Phys. A 70, 365-376 (2000).
Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26.5.
Korenivski, et al., Thermally Activiated Switching in Spin-Flop Tunnel Junctions, Applied Physics Letters 86, 252506 (2005).
Macak et al., High-Aspect-Ratio TiO2, Nanotubes by Anodization of Titanium, Angew. Chem. Int. Ed. 2005, 44, 2100-2102.
Masuda and Kenji Fukuda, Science, 268, 1466 91995).
Masuda et al., Ordered Metal Nanohole Arrays Made by a Two-Step Replication of Honeycomb Structures of Anodic Alumina, Science, OI. 268, Jun. 9, 1995.
Meng et al., A Spintronics Full Adder for Magnetic CPU, IEEE Elec. Dev. Lett. 26, 360 (2005).
Meng et al., Spin Transfer in Nanomagnetic Devices with Perpendicular Anistropy, Applied Physics Letters 88, 172506 (2006).
Miura et al., A Novel SPRAM (Spin Transfer Torque RAM) with a Synthetic Ferrimagnetic Free Layer . . . ., VLSI Symposium on VLSI Tech. Digest of Technical Papers (2007).
Ney et al., Programmable Computing with a Single Magnetoresistance Element, Nature 425, 485 (2003).
PCT Search Report and Written Opinion dated Oct. 4, 2010, Our Ref: 15010W000.
PCT Search Report and Written Opinion dated Mar. 10, 2010, Our Ref: 13835W000.
Prejbeanu et al., Thermally Assisted Mram, J. Phys. Condens. Matter 19 (2007) 165218 (23 pp).
Seki et al., Spin-Polarized Current-Induced Magnetization Reversal in Perpendicularly Magnetized L10-FePt Layers, Applied Physics Letters 88, 172504 (2006).
Sharrock, Time Dependence of Switching Fields in Magnetic Recording Media (Invited), J. Appl. Phys. 76 (10), 15 Nov. 1994.
Sun, Current-Driven Magnetic Switching in Manganite Trilayer Junctions, Journal of Magnetism and Magnetic Materials 202 (1999) 157-162.
Thurn-Albrecht et al., Science, 290, 2126 (2000).
U.S. Appl. No. 12/416,976, filed Apr. 2, 2009, Inventor: Zheng, Our Ref: 14630.
U.S. Appl. No. 12/106,382 filed Apr. 21, 2008, Inventors: Xi et al.
U.S. Appl. No. 12/125,975 filed May 23, 2008, Inventor: Xi, Our Ref: 13866.00.
U.S. Appl. No. 12/126,014 filed May 23, 2008, Inventor: Xiaohua Lou, Our Ref: 14204.00.
U.S. Appl. No. 12/170,519, filed Jul. 10, 2008, Inventors: Xi et al.
U.S. Appl. No. 12/175,545 filed Jul. 18, 2008, Inventor: Lou.
U.S. Appl. No. 12/258,476 filed Oct. 27, 2008, Inventor: Lou.
U.S. Appl. No. 12/258,491 filed Oct. 27, 2008, Inventor: Lou.
U.S. Appl. No. 12/258,492 filed Oct. 27, 2008, Inventor: Lou.
U.S. Appl. No. 12/269,507 filed Nov. 12, 2008, Inventor: Tian.
U.S. Appl. No. 12/269,514 filed Nov. 12, 2008, Inventor: Venkatasamy.
U.S. Appl. No. 12/269,537 filed Nov. 12, 2008, Inventor: Tang et al.
U.S. Appl. No. 12/396,905 Filed Mar. 3, 2009, Inventor: Gao, Our Ref: 14689.
U.S. Appl. No. 12/398,214 filed Mar. 5, 2009, Inventor: Wang et al.
U.S. Appl. No. 12/425,457, filed Apr. 17, 2009, Inventor: Gao.
Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).
Wendt et al., Electronic and Vibrational Properties of Ultrathin Si02 Films Grown on Mo(112), 2005, Phys. Rev. vol. B72, pp. 1150409-1-115409.0.
Yan et al., Magnesium Oxide as a Candidate High-k Gate Dielectric, 2006, Applied Physics Lett. vol. 88, pp. 142901-1-142901-3.
Yen et al., Reduction in Critical Current Density for Spin Torque Transfer Switching with Composite Free Layer, Applied Physics Letters 93, 092504 (2008).
Zheng et al., Magnetic Random Access Memory (MRAM), Journal of Nanoscience and Nanotechnology, vol. 7, 117-137 (2007).
Zhuang et al., Tech Dig. IEDM (2002) 193.

* cited by examiner

FLUX-CLOSED STRAM WITH ELECTRONICALLY REFLECTIVE INSULATIVE SPACER

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One concern in traditional STRAM design is the thickness tradeoff between of the free layer of the STRAM cell. A thicker free layer improves the thermal stability and data retention but also increases the switching current requirement since it is proportional to the thickness of the free layer. Thus, the amount of current required to switch the STRAM cell between resistance data states is large.

BRIEF SUMMARY

The present disclosure relates to a flux-closed spin-transfer torque memory unit that includes a specular insulator spacer. The specular insulator spacer is also referred to as an electrically insulating and electronically reflective layer. The electrically insulating and electronically reflective layer reflects spin electrons back into the free layer to assist in switching the magnetization orientation of the free layer, thus reducing the switching current required for the spin-transfer torque memory unit.

In one particular embodiment, a flux-closed spin-transfer torque memory having a specular insulative spacer is disclosed. The flux-closed spin-transfer torque memory unit includes a multilayer free magnetic element including a first free magnetic layer anti-ferromagnetically coupled to a second free magnetic layer through an electrically insulating and electronically reflective layer. An electrically insulating and non-magnetic tunneling barrier layer separates the free magnetic element from a reference magnetic layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a flux-closed spin-transfer torque memory that includes a specular insulator spacer. The specular insulator spacer is also referred to as an electrically insulating and electronically reflective layer. The electrically insulating and electronically reflective layer reflects spin electrons back into the free layer to assist in switching the magnetization orientation of the free layer, thus reducing the switching current required for the spin-transfer torque memory unit. The flux-closed structure of the free layer element improves thermal stability and data retention of the memory unit. Also, magnetic interference with adjacent memory cells in a memory cell array is minimized due to the near zero moment of the free layer element. While the present disclosure is not so limited, an appreciation of various aspects of the disclosure will be gained through a discussion of the examples provided below.

Figure 1:
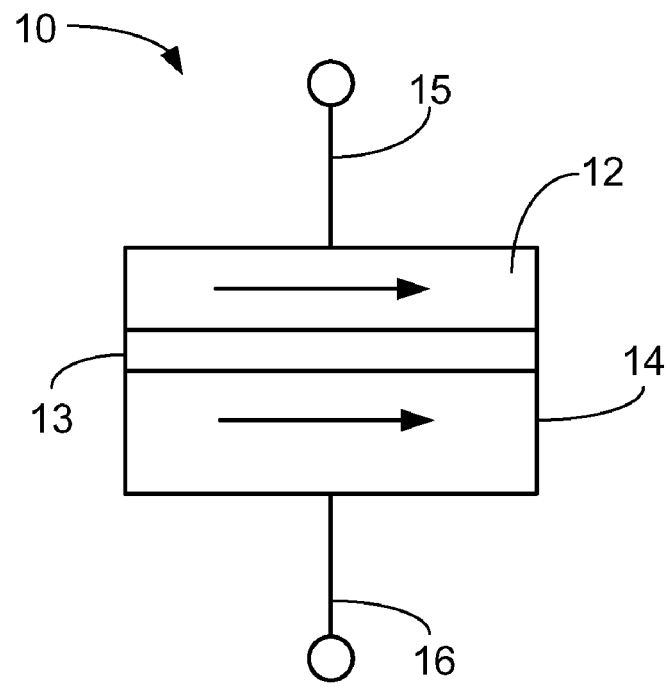
FIG. 1 is a cross-sectional schematic diagram of an illustrative magnetic tunneling junction (MTJ) in the low resistance state.
Figure 2:
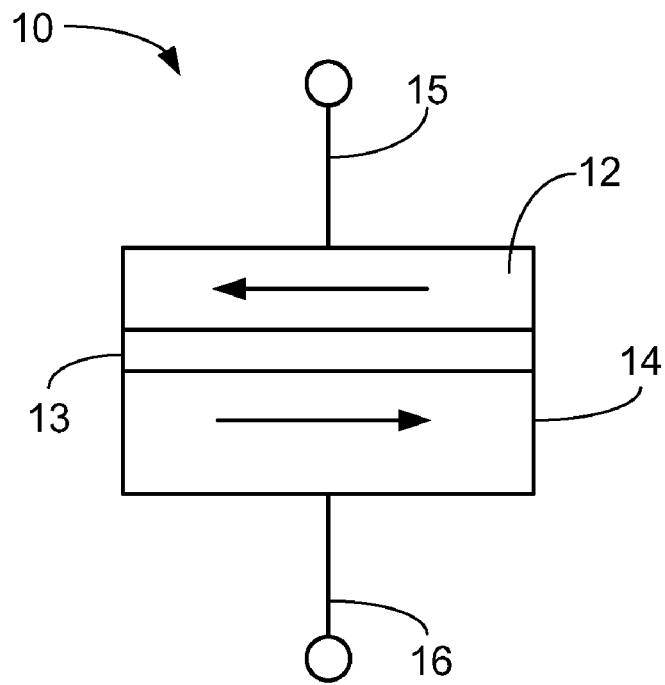
FIG. 2 is a cross-sectional schematic diagram of the illustrative MTJ in the high resistance state.

FIG. 1 is a cross-sectional schematic diagram of an illustrative magnetic tunneling junction (MTJ) cell 10 in the low resistance state and FIG. 2 is a cross-sectional schematic diagram of the illustrative MTJ cell 10 in the high resistance state. The MTJ cell can be any useful memory cell that can switch between a high resistance state and a low resistance state. In many embodiments, the variable resistive memory cell described herein is a spin-transfer torque memory cell.

The MTJ cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunneling barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating tunneling barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the MTJ cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the MTJ cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the MTJ cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the MTJ cell 10 via spin-transfer occurs when a current, passing through a magnetic layer of the MTJ cell 10, becomes spin polarized and imparts a spin torque on the free layer 12 of the MTJ cell 10. When a sufficient spin torque is applied to the free layer 12, the magnetization orientation of the free layer 12 can be switched between two opposite directions and accordingly the MTJ cell 10 can be switched between the parallel state (i.e., low resistance state or "0" data state) and anti-parallel state (i.e., high resistance state or "1" data state) depending on the direction of the current.

The illustrative spin-transfer torque MTJ cell 10 may be used to construct a memory device that includes multiple variable resistive memory cells where a data bit is stored in magnetic tunnel junction cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque MTJ cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
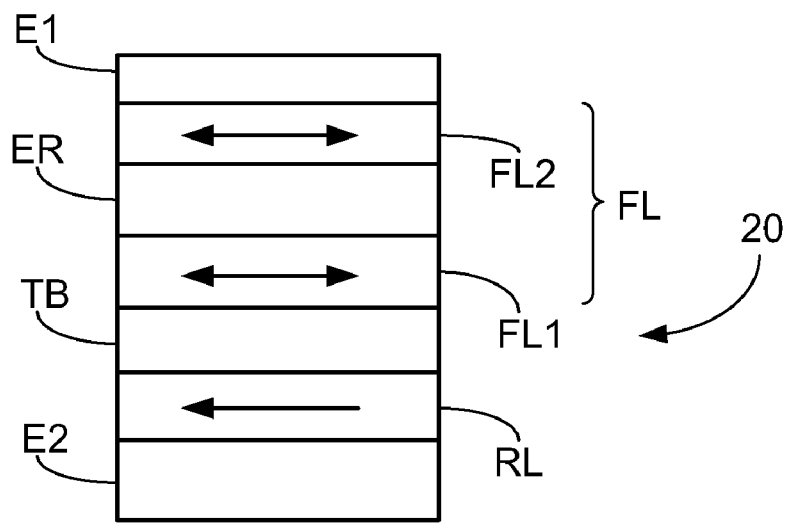
FIG. 3 is a schematic diagram of an illustrative flux-closed spin-transfer torque memory unit.

FIG. 3 is a schematic diagram of an illustrative spin-transfer torque memory unit 20. The spin-transfer torque memory unit 20 includes a multilayer free magnetic element FL, a reference magnetic layer RL, and an electrically insulating and non-magnetic tunneling barrier layer TB separating the multilayer free magnetic element FL from the reference magnetic layer RL.

The multilayer free magnetic element FL includes a first free magnetic layer FL1 that is anti-ferromagnetically coupled to a second free magnetic layer FL2 through an electrically insulating and electronically reflective layer ER. The first free magnetic layer FL1 has a magnetization orientation that is in anti-parallel relation to the second free magnetic layer FL2 magnetization orientation. Thus, this dual junction free layer element is referred to as a "flux-closed" structure. The anti-ferromagnetically coupling can come from either interlayer coupling or static coupling. This flux-closed free magnetic element can thus, be easily switched by a spin polarized current. This flux-closed free magnetic element has a high thermal stability and a high data retention. In addition the net moment of the flux-closed free magnetic element is zero or near zero, thus no static field is applied on an adjacent cell and interference between cells is minimized.

The reference magnetic layer RL can be any useful ferromagnetic material with an acceptable spin polarization range of more than 0.5, as described above. The free magnetic layers FL1 and FL2 can be any ferromagnetic material with acceptable anisotropy, as described above. The first electrode layer E1 and the second electrode layer E2 provide a current of electrons that can switch the magnetization orientation of the multilayer free magnetic element FL between two opposite directions and accordingly the spin-transfer torque memory unit 20 can be switched between the parallel state (i.e., low resistance state or "0" data state) and anti-parallel state (i.e., high resistance state or "1" data state) depending on the direction of the current, as described above.

The electrically insulating and electronically reflective layer ER can be a thin oxide layer or nitride layer and formed of any useful electrically insulating and electronically reflective material such as, for example, MgO, CuO, TiO, AlO, TaO, or TaN, SiN. The thickness of the electrically insulating and electronically reflective layer ER can be in a range from 3 to 15 Angstroms, or from 5 to 15 Angstroms. The electrically insulating and electronically reflective layer ER has an area resistance from 1 to 10 ohms$\mu m^2$.

The electrically insulating and electronically reflective layer ER is able to reflect at least a portion of electrons back into the free magnetic layer FL1 and/or FL2 and allows at least a portion of the electrons to pass through the electrically insulating and electronically reflective layer ER. These reflected electrons are able to enhance the spin current efficiency, effectively reducing the amount of current that needs to be applied through the flux-closed spin-transfer torque memory unit 20 to switch the memory unit 20 between the parallel state (i.e., low resistance state or "0" data state) and anti-parallel state (i.e., high resistance state or "1" data state). Thus, since the electrically insulating and electronically reflective layer ER can reflect the spin electrons to increase the spin current efficiency, the switching current can be reduced significantly.

In some embodiments, the electrically insulating and electronically reflective layer ER can have a non-uniform thickness. The canted current resulting from this can further increase the spin efficiency to further reduce the switching current. The non-uniform electrically insulating and electronically reflective layer ER can also reduce the serial resistance to maintain the output signal.

In some embodiments, the electrically insulating and electronically reflective layer ER can have a non-uniform thickness. The canted current resulting from this can further increase the spin efficiency to further reduce the switching current. The non-uniform electrically insulating and electronically reflective layer ER can also reduce the serial resistance to maintain the output signal. While two embodiments of a non-uniform electrically insulating and electronically reflective layer ER are shown and described below, it is understood that any non-uniform electrically insulating and electronically reflective layer ER structure is within the scope of this disclosure.

Figure 4A:
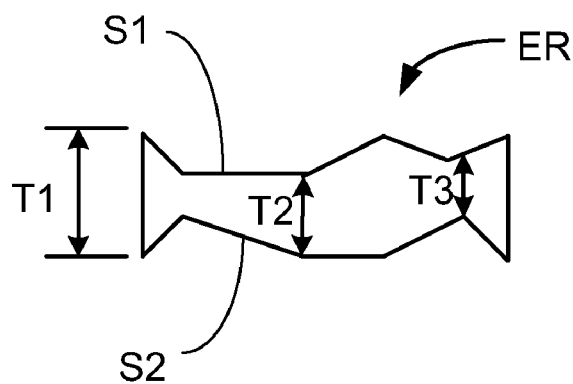
FIG. 4A is a schematic cross-sectional diagram of an illustrative non-uniform electrically insulating and electronically reflective layer.

FIG. 4A is a schematic cross-sectional diagram of an illustrative non-uniform electrically insulating and electronically reflective layer ER. In this illustrated embodiment of a electrically insulating and electronically reflective layer ER having a non-uniform thickness the electrically insulating and electronically reflective layer ER has opposing major surfaces S1 and S2 defining peaks and valleys and provide the electrically insulating and electronically reflective layer ER with a plurality of varying thicknesses T1, T2 and T3. Current travels through the opposing non-planar major surfaces S1 and S2 along a thickness direction of the electrically insulating and electronically reflective layer ER.

Figure 4B:
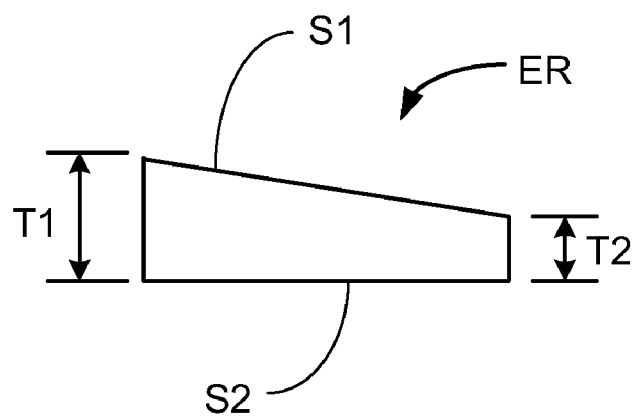
FIG. 4B is a schematic cross-sectional diagram of another illustrative non-uniform electrically insulating and electronically reflective layer.

FIG. 4B is a schematic cross-sectional diagram of another illustrative non-uniform electrically insulating and electronically reflective layer ER. In this illustrated embodiment of a electrically insulating and electronically reflective layer ER having a non-uniform thickness the electrically insulating and electronically reflective layer ER has opposing planar major surfaces S1 and S2. The opposing planar major surfaces S1 and S2 define a continuous sloping electrically insulating and electronically reflective layer ER with a first thickness T1 and decreasing to a second thickness T2. Current travels through the opposing non-planar major surfaces S1 and S2 along a thickness direction of the electrically insulating and electronically reflective layer ER.

Figure 5:
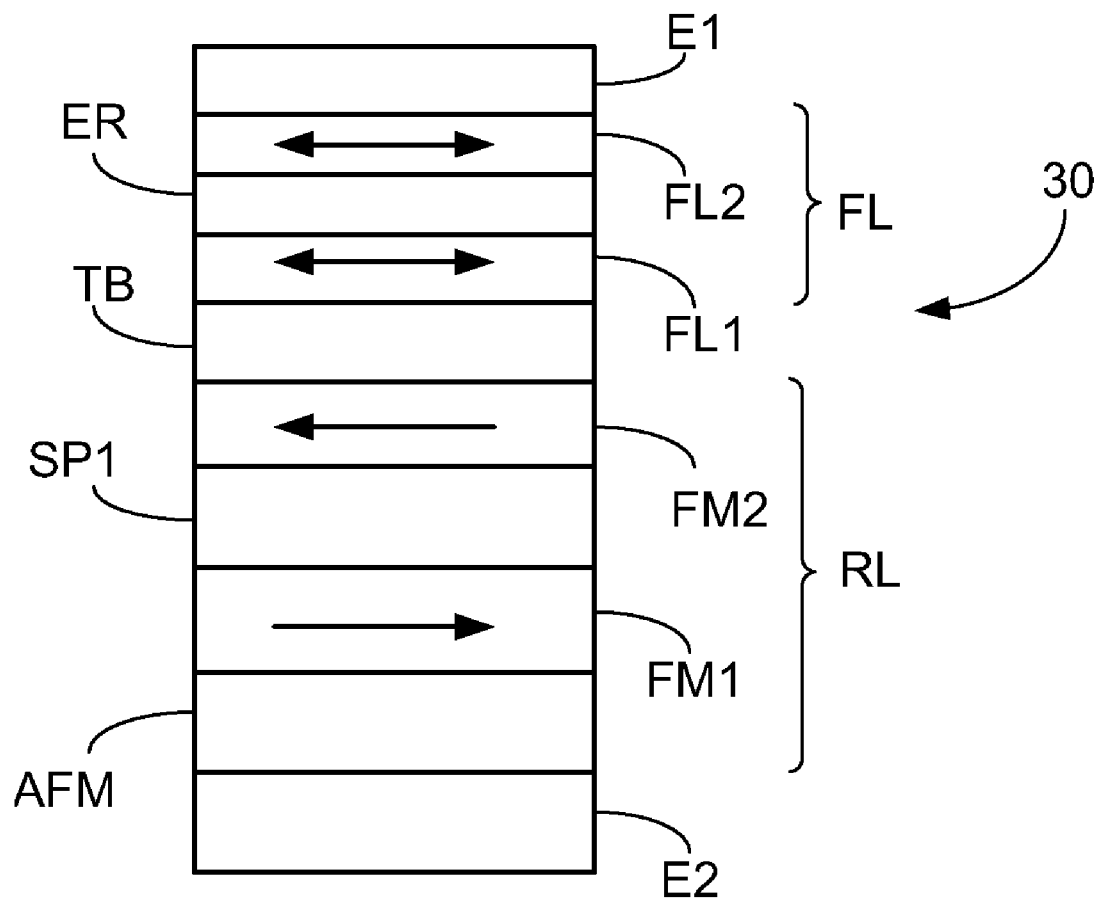
FIG. 5 is a schematic diagram of an illustrative flux-closed spin-transfer torque memory unit including a multilayer reference layer.

FIG. 5 is a schematic diagram of another illustrative flux-closed spin-transfer torque memory unit 30. This embodiment is similar to FIG. 3 with the addition of a synthetic anti-ferromagnetic element forming the reference layer RL. The spin-transfer torque memory unit 30 includes a multilayer free magnetic element FL, a reference magnetic layer RL, and an electrically insulating and non-magnetic tunneling barrier layer TB separating the multilayer free magnetic element FL from the reference magnetic layer RL.

The multilayer free magnetic element FL includes a first free magnetic layer FL1 that is anti-ferromagnetically coupled to a second free magnetic layer FL2 through an electronically electrically insulating and electronically reflective layer ER. The first free magnetic layer FL1 has a magnetization orientation that is in anti-parallel relation to the second free magnetic layer FL2 magnetization orientation. Thus, this dual junction free layer element is referred to as a "flux-closed" structure, as described above.

The illustrated reference magnetic layer RL is referred to as a synthetic anti-ferromagnetic element. The synthetic anti-ferromagnetic element includes a first ferromagnetic layer FM1 and a second ferromagnetic layer FM2 separated by an electrically conductive and non-magnetic spacer layer SP1. The electrically conductive and non-magnetic spacer layer SP1 is configured such that the first ferromagnetic layer FM1 and a second ferromagnetic layer FM2 are anti-ferromagnetically aligned and in many embodiments, the first ferromagnetic layer FM1 and a second ferromagnetic layer FM2 have anti-parallel magnetization orientations, one such orientation is illustrated. An anti-ferromagnetic layer AFM is adjacent to the second electrode layer E2. The anti-ferromagnetic layer AFM assists in pinning the magnetization orientations of the first ferromagnetic layer FM1 and a second ferromagnetic layer FM2.

There are a number of advantages of using a synthetic anti-ferromagnetic element in the disclosed spin-transfer torque memory units. Some advantages include that the static field of the free layer is reduced, the thermal stability of the reference layer is improved, and interlayer diffusion is reduced.

The first ferromagnetic layer FM1 can be any useful ferromagnetic material with an acceptable spin polarization range of more than 0.5, as described above. The second ferromagnetic layer FM2 can be any useful ferromagnetic material, as described above. The anti-ferromagnetic layer AFM pins the ferromagnetic layers through, e.g., the use of exchange bias with an antiferromagnetically ordered material such as PtMn, IrMn, and others. The electrically conductive and non-magnetic spacer layer SP1 can be formed of any useful electrically conductive and non-ferromagnetic material such as, for example, Ru, Pd, and the like.

The free magnetic layers FL1 and FL2 can be any ferromagnetic material with acceptable anisotropy, as described above. The first electrode layer E1 and the second electrode layer E2 provide a current of electrons that can switch the magnetization orientation of the multilayer free magnetic element FL between two opposite directions and accordingly the spin-transfer torque memory unit 30 can be switched between the parallel state (i.e., low resistance state or "0" data state) and anti-parallel state (i.e., high resistance state or "1" data state) depending on the direction of the current, as described above.

The electrically insulating and electronically reflective layer ER can be a thin oxide layer or nitride layer and formed of any useful electrically insulating and electronically reflective material such as, for example, MgO, CuO, TiO, AlO, TaO, or TaN, SiN. The thickness of the electrically insulating and electronically reflective layer ER can be in a range from 3 to 15 Angstroms, or from 5 to 15 Angstroms. The electrically insulating and electronically reflective layer ER has an area resistance from 1 to 10 ohms$\mu m^2$.

The electrically insulating and electronically reflective layer ER is able to reflect at least a portion of electrons back into the free magnetic layer FL1 and/or FL2 and allows at least a portion of the electrons to pass through the electrically insulating and electronically reflective layer ER. These reflected electrons are able to enhance the spin current efficiency, effectively reducing the amount of current that needs to be applied through the flux-closed spin-transfer torque memory unit 30 to switch the memory unit 30 between the parallel state (i.e., low resistance state or "0" data state) and anti-parallel state (i.e., high resistance state or "1" data state). Thus, since the electrically insulating and electronically reflective layer ER can reflect the spin electrons to increase the spin current efficiency, the switching current can be reduced significantly.

In some embodiments, the electrically insulating and electronically reflective layer ER can have a non-uniform thickness. The canted current resulting from this can further increase the spin efficiency to further reduce the switching current. The non-uniform electrically insulating and electronically reflective layer ER can also reduce the serial resistance to maintain the output signal.

Figure 6A:
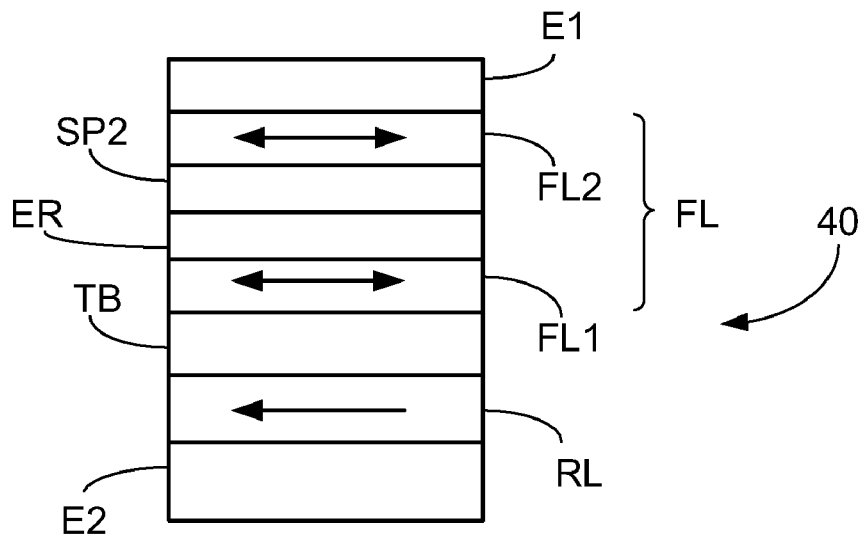
FIG. 6A is a schematic diagram of an illustrative flux-closed spin-transfer torque memory unit including a spacer layer.

FIG. 6A is a schematic diagram of another illustrative flux-closed spin-transfer torque memory unit 40. This embodiment is similar to FIG. 3 with the addition of an electrically conductive and non-magnetic spacer layer SP2 in the multilayer free magnetic element FL. The spin-transfer torque memory unit 40 includes a multilayer free magnetic element FL, a reference magnetic layer RL, and an electrically insulating and non-magnetic tunneling barrier layer TB separating the multilayer free magnetic element FL from the reference magnetic layer RL. A second electrode layer E2 is adjacent to the reference magnetic layer RL.

The multilayer free magnetic element FL includes a first free magnetic layer FL1 that is anti-ferromagnetically coupled to a second free magnetic layer FL2 through an electrically insulating and electronically reflective layer ER and an electrically conductive and non-magnetic spacer layer SP2. The electrically conductive and non-magnetic spacer layer SP2 separates the electrically insulating and electronically reflective layer ER and the second free magnetic layer FL2. However in other embodiments, the electrically conductive and non-magnetic spacer layer SP2 separates the electrically insulating and electronically reflective layer ER and the first free magnetic layer FL1. The first free magnetic layer FL1 has a magnetization orientation that is in anti-parallel relation to the second free magnetic layer FL2 magnetization orientation. Thus, this dual junction free layer element is referred to as a "flux-closed" structure, as described above.

Figure 6B:
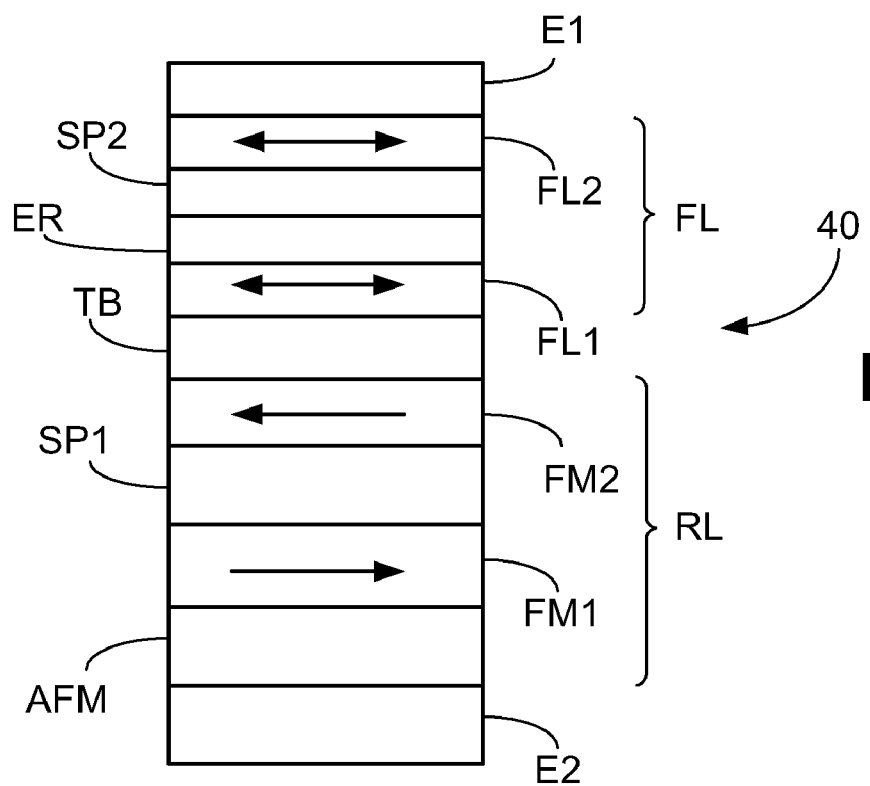
FIG. 6B is a schematic diagram of an illustrative flux-closed spin-transfer torque memory unit including a spacer layer and a multilayer reference layer.

FIG. 6B is a schematic diagram of another illustrative flux-closed spin-transfer torque memory unit 40. This embodiment is similar to FIG. 6A with the addition of a synthetic anti-ferromagnetic element forming the reference layer RL. The spin-transfer torque memory unit 40 includes a multilayer free magnetic element FL, a reference magnetic layer RL, and an electrically insulating and non-magnetic tunneling barrier layer TB separating the multilayer free magnetic element FL from the reference magnetic layer RL.

The illustrated reference magnetic layer RL is referred to as a synthetic anti-ferromagnetic element. The synthetic anti-ferromagnetic element includes a first ferromagnetic layer FM1 and a second ferromagnetic layer FM2 separated by an electrically conductive and non-magnetic spacer layer SP1. The electrically conductive and non-magnetic spacer layer SP1 is configured such that the first ferromagnetic layer FM1 and a second ferromagnetic layer FM2 are anti-ferromagnetically aligned and in many embodiments, the first ferromagnetic layer FM1 and a second ferromagnetic layer FM2 have anti-parallel magnetization orientations, as illustrated. An anti-ferromagnetic layer AFM is adjacent to the second electrode layer E2. The anti-ferromagnetic layer AFM assists in pinning the magnetization orientations of first ferromagnetic layer FM1 and second ferromagnetic layer FM2.

There are a number of advantages of using a synthetic anti-ferromagnetic element in the disclosed spin-transfer torque memory units. Some advantages include that the static field of the free layer is reduced, the thermal stability of the reference layer is improved, and interlayer diffusion is reduced.

First ferromagnetic layer FM1 and second ferromagnetic layer FM2 can be any useful ferromagnetic material with an acceptable spin polarization range of more than 0.5, as described above. The anti-ferromagnetic layer AFM pins the ferromagnetic layers through, e.g., the use of exchange bias with an antiferromagnetically ordered material such as PtMn, IrMn, and others. The electrically conductive and non-magnetic spacer layers SP1 and SP2 can be formed of any useful electrically conductive and non-ferromagnetic material such as, for example, Ru, Pd, and the like.

The free magnetic layers FL1 and FL2 can be any ferromagnetic material with acceptable anisotropy, as described above. The first electrode layer E1 and the second electrode layer E2 provide a current of electrons that can switch the magnetization orientation of the multilayer free magnetic element FL between two opposite directions and accordingly the spin-transfer torque memory unit 40 can be switched between the parallel state (i.e., low resistance state or "0" data state) and anti-parallel state (i.e., high resistance state or "1" data state) depending on the direction of the current, as described above.

The electrically insulating and electronically reflective layer ER can be a thin oxide layer or nitride layer and formed of any useful electrically insulating and electronically reflective material such as, for example, MgO, CuO, TiO, AlO, TaO, or TaN, SiN. The thickness of the electrically insulating and electronically reflective layer ER can be in a range from 3 to 15 Angstroms, or from 5 to 15 Angstroms. In many embodiments, the electrically insulating and electronically reflective layer ER has an area resistance from 1 to 10 ohms$\mu m^2$.

In some embodiments where the multilayer free magnetic element FL includes the electrically insulating and electronically reflective layer ER (having a thickness from 3-20 Angstroms) and the electrically conductive and non-magnetic spacer layer SP2 (having a thickness from 5-20 Angstroms), the electrically insulating and electronically reflective layer ER can have a larger area resistance such as, for example, from 5 to 50 ohms$\mu m^2$. Suitable electrically insulating and electronically reflective ER materials for these embodiments include, for example, CoFe-O, AlO, NiFeO, MgO, CoFeB-O, NiFe-O where the electrically conductive and non-magnetic spacer layer SP2 materials includes, for example, Cu, Au, Ag, Cr, Al, Ta, Ru, or W.

The electrically insulating and electronically reflective layer ER is able to reflect at least a portion of electrons back into the free magnetic layer FL1 and/or FL2 and allows at least a portion of the electrons to pass through the electrically insulating and electronically reflective layer ER. These reflected electrons are able to enhance the spin current efficiency, effectively reducing the amount of current that needs to be applied through the flux-closed spin-transfer torque memory unit 40 to switch the memory unit 40 between the parallel state (i.e., low resistance state or "0" data state) and anti-parallel state (i.e., high resistance state or "1" data state). Thus, since the electrically insulating and electronically reflective layer ER can reflect the spin electrons to increase the spin current efficiency, the switching current can be reduced significantly.

In some embodiments, the electrically insulating and electronically reflective layer ER can have a non-uniform thickness, as described above. The canted current resulting from this can further increase the spin efficiency to further reduce the switching current. The non-uniform electrically insulating and electronically reflective layer ER can also reduce the serial resistance to maintain the output signal.

Figure 7A:
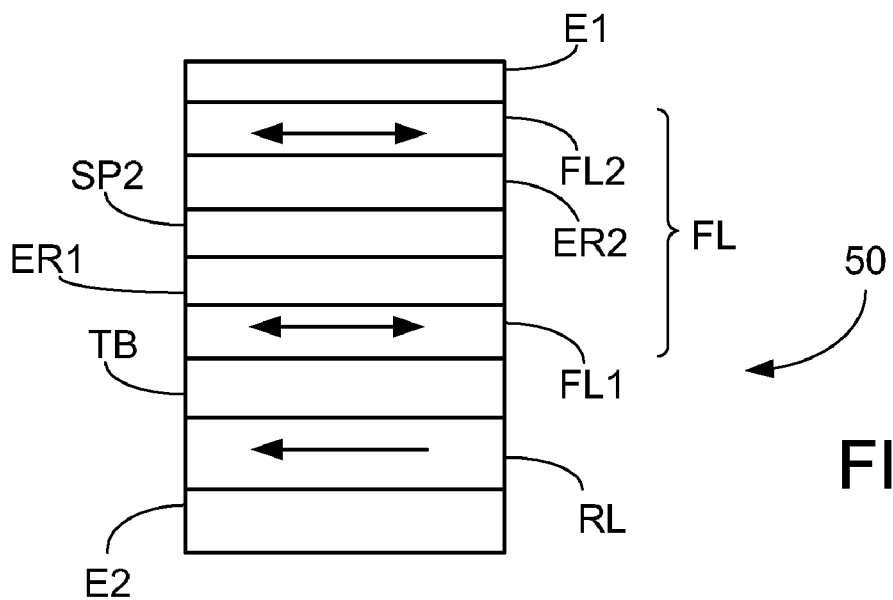
FIG. 7A is a schematic diagram of an illustrative flux-closed spin-transfer torque memory unit including a spacer layer and a second specular spacer layer.

FIG. 7A is a schematic diagram of another illustrative flux-closed spin-transfer torque memory unit 50. This embodiment is similar to FIG. 6A with the addition of an electronically electrically insulating and electronically reflective layer ER in the multilayer free magnetic element FL. The spin-transfer torque memory unit 50 includes a multilayer free magnetic element FL, a reference magnetic layer RL, and an electrically insulating and non-magnetic tunneling barrier layer TB separating the multilayer free magnetic element FL from the reference magnetic layer RL.

The multilayer free magnetic element FL includes a first free magnetic layer FL1 that is anti-ferromagnetically coupled to a second free magnetic layer FL2 through an electronically electrically insulating and electronically reflective layer ER and an electrically conductive, non-magnetic spacer layer SP2 and a second electronically electrically insulating and electronically reflective layer ER2. The electrically conductive and non-magnetic spacer layer SP2 separates the electronically electrically insulating and electronically reflective layer ER and the second electronically electrically insulating and electronically reflective layer ER2. The first free magnetic layer FL1 has a magnetization orientation that is in anti-parallel relation to the second free magnetic layer FL2 magnetization orientation. Thus, this dual junction free layer element is referred to as a "flux-closed" structure, as described above.

Figure 7B:
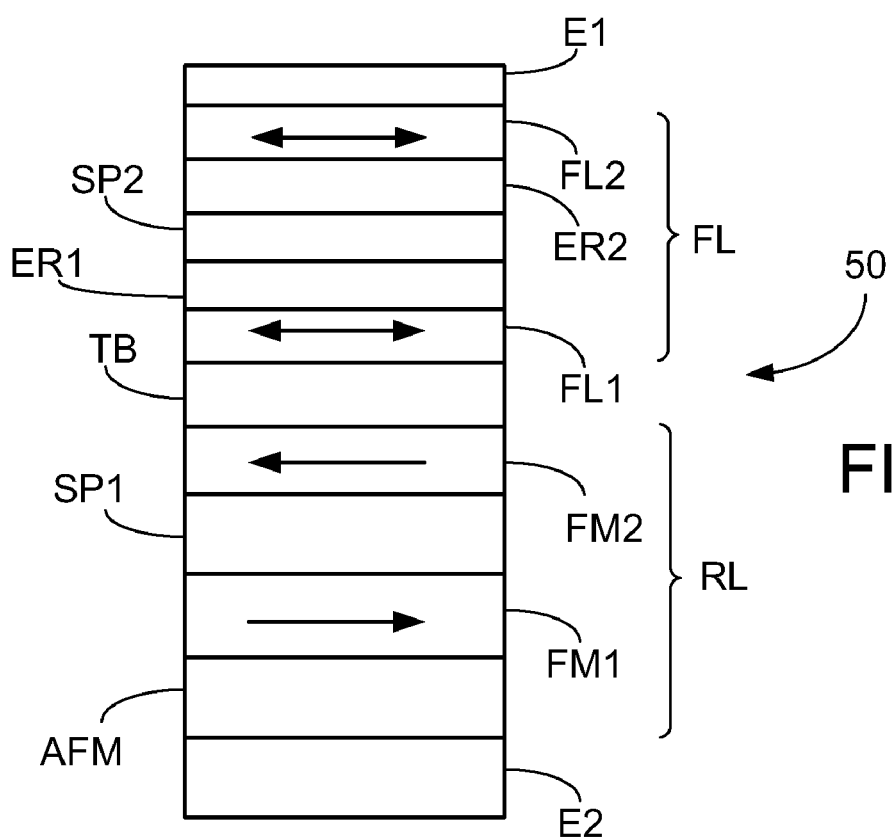
FIG. 7B is a schematic diagram of an illustrative flux-closed spin-transfer torque memory unit including a spacer layer, a multilayer reference layer, and a second specular spacer layer.

FIG. 7B is a schematic diagram of another illustrative flux-closed spin-transfer torque memory unit 50. This embodiment is similar to FIG. 7A with the addition of a synthetic anti-ferromagnetic element forming the reference layer RL. The spin-transfer torque memory unit 40 includes a multilayer free magnetic element FL, a reference magnetic layer RL, and an electrically insulating and non-magnetic tunneling barrier layer TB separating the multilayer free magnetic element FL from the reference magnetic layer RL.

The illustrated reference magnetic layer RL is referred to as a synthetic anti-ferromagnetic element. The synthetic anti-ferromagnetic element includes a first ferromagnetic layer FM1 and a second ferromagnetic layer FM2 separated by an electrically conductive and non-magnetic spacer layer SP1. The electrically conductive and non-magnetic spacer layer SP1 is configured such that the first ferromagnetic layer FM1 and a second ferromagnetic layer FM2 are anti-ferromagnetically aligned and in many embodiments, the first ferromagnetic layer FM1 and a second ferromagnetic layer FM2 have anti-parallel magnetization orientations, as illustrated. An anti-ferromagnetic layer AFM is adjacent to the second electrode layer E2. The anti-ferromagnetic layer AFM assist in pinning the magnetization orientations of the first ferromagnetic layer FM1 and a second ferromagnetic layer FM2.

There are a number of advantages of using a synthetic anti-ferromagnetic element in the disclosed spin-transfer torque memory units. Some advantages include that the static field of the free layer is reduced, the thermal stability of the reference layer is improved, and interlayer diffusion is reduced.

The first ferromagnetic layer FM1 and a second ferromagnetic layer FM2 can be any useful ferromagnetic material with an acceptable spin polarization range of more than 0.5, as described above. The anti-ferromagnetic layer AFM pins the ferromagnetic layers through, e.g., the use of exchange bias with an antiferromagnetically ordered material such as PtMn, IrMn, and others. The electrically conductive and non-magnetic spacer layers SP1 and SP2 can be formed of any useful electrically conductive and non-ferromagnetic material such as, for example, Ru, Pd, and the like.

The free magnetic layers FL1 and FL2 can be any ferromagnetic material with acceptable anisotropy, as described above. The first electrode layer E1 and the second electrode layer E2 provide a current of electrons that can switch the magnetization orientation of the multilayer free magnetic element FL between two opposite directions and accordingly the spin-transfer torque memory unit 50 can be switched between the parallel state (i.e., low resistance state or "0" data state) and anti-parallel state (i.e., high resistance state or "1" data state) depending on the direction of the current, as described above.

The electrically insulating and electronically reflective layer ER and/or ER2 can independently be a thin oxide layer or nitride layer and formed of any useful electrically insulating and electronically reflective material such as, for example, MgO, CuO, TiO, AlO, TaO, TaN, or SiN. The thickness of the electrically insulating and electronically reflective layer ER and/or ER2 can be in a range from 3 to 15 Angstroms, or from 5 to 15 Angstroms. In many embodiments, the electrically insulating and electronically reflective layer ER and/or ER2 has an area resistance from 1 to 10 ohms$\mu m^2$.

In some embodiments where the multilayer free magnetic element FL includes two electrically insulating and electronically reflective layers ER and ER2 (each having a thickness from 3-20 Angstroms) separated by the electrically conductive and non-magnetic spacer layer SP2 (having a thickness from 5-20 Angstroms), the electrically insulating and electronically reflective layers ER and ER2 can have a larger area resistance such as, for example, from 5 to 50 ohms$\mu m^2$. Suitable electrically insulating and electronically reflective ER and ER2 materials for these embodiments include, for example, CoFe-O, AlO, NiFeO, MgO, CoFeB-O, NiFe-O where the electrically conductive and non-magnetic spacer layer SP2 materials includes, for example, Cu, Au, Ag, Cr, Al, Ta, Ru, or W.

The electrically insulating and electronically reflective layers ER and ER2 are able to reflect at least a portion of electrons back into the free magnetic layer FL1 and/or FL2 and allows at least a portion of the electrons to pass through the electrically insulating and electronically reflective layer ER and ER2. These reflected electrons are able to enhance the spin current efficiency, effectively reducing the amount of current that needs to be applied through the flux-closed spin-transfer torque memory unit 50 to switch the memory unit 50 between the parallel state (i.e., low resistance state or "0" data state) and anti-parallel state (i.e., high resistance state or "1" data state). Thus, since the electrically insulating and electronically reflective layers ER and ER2 can reflect the spin electrons to increase the spin current efficiency, the switching current can be reduced significantly.

In some embodiments, the one or both of the electrically insulating and electronically reflective layers ER and ER2 can have a non-uniform thickness, as described above. The canted current resulting from this can further increase the spin efficiency to further reduce the switching current. The non-uniform electrically insulating and electronically reflective layer ER and/or ER2 can also reduce the serial resistance to maintain the output signal.

In some embodiments, the flux-closed spin-transfer torque memory units described above can include a material layer that scatters spin electrons instead of reflecting spin electrons. This spin electron scatter layer can be in addition to or replace the electrically insulating and electronically reflective layer, described above. The spin electron scatter layer can be formed of an electrically conductive metal such as, for example, Ru, Pd, Ta, Pt, Al, and the like. The thickness of this layer can be in a range from 10 to 50 Angstroms.

Thus, embodiments of the FLUX-CLOSED STRAM WITH ELECTRONICALLY REFLECTIVE INSULATIVE SPACER are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A spin-transfer torque memory unit, comprising:
   a flux-closed multilayer free magnetic element comprising a first free magnetic layer anti-ferromagnetically coupled to a second free magnetic layer through an electrically insulating and electronically reflective layer;
   a reference magnetic layer; and
   an electrically insulating and non-magnetic tunneling barrier layer separating the flux-closed multilayer free magnetic element from the reference magnetic layer.

2. A spin-transfer torque memory unit according to claim 1, wherein the electrically insulating and electronically reflective layer has a non-uniform thickness.

3. A spin-transfer torque memory unit according to claim 1, wherein the electrically insulating and electronically reflective layer has a thickness value in a range from 3 to 15 Angstroms.

4. A spin-transfer torque memory unit according to claim 1, wherein the electrically insulating and electronically reflective layer comprises MgO, CuO, TiO, AlO, TaO, TaN, or SiN.

5. A spin-transfer torque memory unit according to claim 1, wherein the electrically insulating and electronically reflective layer has an area resistance from 1 to 10 ohms$\mu m^2$.

6. A spin-transfer torque memory unit according to claim 1, wherein the reference magnetic layer comprises a synthetic anti-ferromagnetic element.

7. A spin-transfer torque memory unit according to claim 1, wherein the multilayer free magnetic element further comprises an electrically conductive non-ferromagnetic layer separating the electrically insulating and electronically reflective layer from one of the first free magnetic layer or the second free magnetic layer.

8. A spin-transfer torque memory unit according to claim 7, wherein the multilayer free magnetic element further comprises a second electrically insulating and electronically reflective layer and the electrically conductive non-ferromagnetic layer separates the electrically insulating and electronically reflective layer from the second electrically insulating and electronically reflective layer.

9. A spin-transfer torque memory unit according to claim 7, wherein the electrically conductive non-ferromagnetic layer has a thickness value in a range from 5 to 20 Angstroms.

10. A spin-transfer torque memory unit according to claim 7, wherein the electrically conductive non-ferromagnetic layer comprises Ta, Cu, Ru, or Au.

11. A flux-closed spin-transfer torque memory unit, comprising:
    a multilayer free magnetic element comprising a first free magnetic layer anti-ferromagnetically coupled to a second free magnetic layer through an electrically insulating and electronically reflective layer and a electrically conductive non-ferromagnetic layer;
    a reference magnetic layer; and
    an electrically insulating and non-magnetic tunneling barrier layer separating the free magnetic element from the reference magnetic layer.

12. A flux-closed spin-transfer torque memory unit according to claim 11, wherein the electrically insulating and electronically reflective layers has a non-uniform thickness.

13. A flux-closed spin-transfer torque memory unit according to claim 11, wherein the electrically insulating and electronically reflective layer has a thickness value in a range from 3 to 15 Angstroms.

14. A flux-closed spin-transfer torque memory unit according to claim 11, wherein the electrically insulating and electronically reflective layer comprises MgO, CuO, TiO, AlO, TaO, TaN, or SiN.

15. A flux-closed spin-transfer torque memory unit according to claim 11, wherein the electrically insulating and electronically reflective layer has an area resistance from 1 to 10 ohms$\mu m^2$.

16. A flux-closed spin-transfer torque memory unit according to claim 11, wherein the reference magnetic layer comprises a synthetic anti-ferromagnetic element.

17. A flux-closed spin-transfer torque memory unit according to claim 11, wherein the multilayer free magnetic element further comprises a second electrically insulating and electronically reflective layer and the electrically conductive non-ferromagnetic layer separates the electrically insulating and electronically reflective layer from the second electrically insulating and electronically reflective layer.

18. A flux-closed spin-transfer torque memory unit according to claim 11, wherein the electrically conductive non-ferromagnetic layer has a thickness value in a range from 5 to 20 Angstroms.

19. A flux-closed spin-transfer torque memory unit according to claim 11, wherein the electrically conductive non-ferromagnetic layer comprises Ta, Cu, Ru, or Au.

20. A flux-closed spin-transfer torque memory unit, comprising:
    a multilayer free magnetic element comprising a first free magnetic layer anti-ferromagnetically coupled to a second free magnetic layer through an electrically insulating and electronically reflective layer, the electrically insulating and electronically reflective layer has a thickness value in a range from 3 to 15 Angstroms and comprises MgO, CuO, TiO, AlO, TaO, TaN, or SiN;
    a reference magnetic layer comprising a synthetic anti-ferromagnetic element; and an electrically insulating and non-magnetic tunneling barrier layer separating the free magnetic element from the reference magnetic layer.

21. An article, comprising:

a multilayer free magnetic element comprising a first free magnetic layer having a first magnetization orientation anti-ferromagnetically coupled to a second free magnetic layer having a second magnetization orientation being antiparallel with the first magnetization orientation through an electrically insulating and electronically reflective layer;

a reference magnetic layer; and an electrically insulating and non-magnetic tunneling barrier layer separating the free magnetic element from the reference magnetic layer.

22. An article according to claim 21, wherein the electrically insulating and electronically reflective layer has a non-uniform thickness.

23. An article according to claim 21, wherein the electrically insulating and electronically reflective layer has a thickness value in a range from 3 to 15 Angstroms.

24. An article according to claim 21, wherein the electrically insulating and electronically reflective layer comprises MgO, CuO, TiO, AlO, TaO, TaN, or SiN.

25. An article according to claim 21, wherein the multilayer free magnetic element further comprises an electrically conductive non-ferromagnetic layer separating the electrically insulating and electronically reflective layer from one of the first free magnetic layer or the second free magnetic layer.

26. An article according to claim 25, wherein the multilayer free magnetic element further comprises a second electrically insulating and electronically reflective layer and the electrically conductive non-ferromagnetic layer separates the electrically insulating and electronically reflective layer from the second electrically insulating and electronically reflective layer.

* * * * *